(12) United States Patent
Shimizu et al.

(10) Patent No.: US 8,097,396 B2
(45) Date of Patent: Jan. 17, 2012

(54) POSITIVE RESIST COMPOSITION AND METHOD FOR FORMING RESIST PATTERN

(75) Inventors: Hiroaki Shimizu, Kawasaki (JP); Masaru Takeshita, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 11/597,005

(22) PCT Filed: May 25, 2005

(86) PCT No.: PCT/JP2005/009564
§ 371 (c)(1),
(2), (4) Date: Nov. 17, 2006

(87) PCT Pub. No.: WO2005/116769
PCT Pub. Date: Dec. 8, 2005

(65) Prior Publication Data
US 2008/0063974 A1 Mar. 13, 2008

(30) Foreign Application Priority Data

May 28, 2004 (JP) ................ P2004-159421
Nov. 5, 2004 (JP) ................ P2004-322545

(51) Int. Cl.
*G03F 7/004* (2006.01)
*G03F 7/028* (2006.01)
*G03F 7/039* (2006.01)

(52) U.S. Cl. ................ 430/270.1; 430/910
(58) Field of Classification Search ......... 430/270.1, 430/326, 908, 910
See application file for complete search history.

(56) References Cited

U.S. PATENT DOCUMENTS

| 6,383,713 B1 * | 5/2002 | Uetani et al. ........ 430/270.1 |
| 6,548,221 B2 * | 4/2003 | Uetani et al. ........ 430/270.1 |
| 6,982,140 B2 | 1/2006 | Hada et al. |
| 2001/0014428 A1 | 8/2001 | Uetani et al. |
| 2001/0016298 A1 * | 8/2001 | Nakanishi et al. ........ 430/270.1 |
| 2001/0046641 A1 | 11/2001 | Uetani et al. |
| 2002/0187420 A1 * | 12/2002 | Barclay et al. ........ 430/270.1 |
| 2003/0008968 A1 | 1/2003 | Sugeta et al. |
| 2003/0087183 A1 * | 5/2003 | Nishi et al. ........ 430/270.1 |
| 2003/0224287 A1 * | 12/2003 | Fujimori ........ 430/270.1 |
| 2004/0058269 A1 * | 3/2004 | Hada et al. ........ 430/270.1 |
| 2004/0110085 A1 | 6/2004 | Iwai et al. |
| 2004/0137378 A1 | 7/2004 | Sugeta et al. |
| 2004/0202954 A1 | 10/2004 | Momota et al. |
| 2007/0105038 A1 * | 5/2007 | Takeshita et al. ........ 430/270.1 |
| 2007/0166641 A1 * | 7/2007 | Shimizu et al. ........ 430/270.1 |

FOREIGN PATENT DOCUMENTS

| EP | 1 452 919 A1 | 9/2004 |
| JP | 2000-267269 | 9/2000 |
| JP | 2001-318466 | 11/2001 |
| JP | 2003-005374 | 1/2003 |
| JP | 2003-131382 A | 5/2003 |
| JP | 2003-241385 | 8/2003 |
| JP | 2004-310075 | 11/2004 |

OTHER PUBLICATIONS

Office Action issued Oct. 28, 2008, on the counterpart Japanese Patent Application No. 2004-322545.

* cited by examiner

*Primary Examiner* — Anca Eoff
(74) *Attorney, Agent, or Firm* — Knobbe Martens Olson & Bear LLP

(57) ABSTRACT

A positive resist composition that includes a resin component (A) that exhibits increased alkali solubility under action of acid, and an acid generator component (B) that generates acid on exposure, wherein the component (A) is a copolymer (A1) that includes a structural unit (a1) derived from an acrylate that contains an acid dissociable, dissolution inhibiting group, a structural unit (a2) derived from an α-lower alkyl acrylate that contains a lactone ring, and a structural unit (a3) derived from an (α-lower alkyl)acrylate that contains a polar group-containing polycyclic group.

4 Claims, No Drawings

US 8,097,396 B2

POSITIVE RESIST COMPOSITION AND METHOD FOR FORMING RESIST PATTERN

RELATED APPLICATIONS

This application is the U.S. National Phase filing under 35 U.S.C. §371 of PCT/JP2005/009564, filed May 25, 2005, which designated the United States and was published in a language other than English, which claims priority under 35 U.S.C. §119(a)-(d) to Japanese Patent Application Number 2004-159421, filed May 28, 2004, and Japanese Patent Application Number 2004-322545, filed Nov. 5, 2004. The content of these applications is incorporated herein by reference in their entireties.

TECHNICAL FIELD

The present invention relates to a positive resist composition and a method for forming a resist pattern.

BACKGROUND ART

Chemically amplified photoresist compositions that use a KrF excimer laser, ArF excimer laser, $F_2$ excimer laser, EUV (extreme ultraviolet light) or EB (electron beam) or the like as a light source (a radiation source) generally include a resin component (A) and an acid generator component (B) that generates an acid on irradiation dissolved in an organic solvent (C), as disclosed, for example, in Japanese Unexamined Patent Application, First Publication No. 2003-167347 (patent reference 1).

These types of photoresist compositions require favorable lithography characteristics (including resolution, depth of focus characteristics, and resist pattern shape and the like).

Moreover in recent years, as the demands for higher resolution resist patterns have increased, in addition to the characteristics described above, the photoresist compositions also require improvements beyond the conventionally observed level of defects (surface defects) within the developed resist pattern.

These defects refer to general abnormalities detected by inspection of the resist pattern following developing, from directly above the resist pattern, using a surface defect inspection device (brand name: KLA) from KLA Tencor Corporation. Examples of these abnormalities include post-developing scum, foam, dust, bridges across different portions of the resist pattern, color irregularities, and precipitated deposits and the like.

Moreover in recent years, with the formation of very fine resist patterns of 130 nm or smaller using an ArF excimer laser or more recent light source, namely an ArF excimer laser, a $F_2$ excimer laser, EUV or EB or the like, the problems associated with resolving these post-developing resist pattern defects have become even more demanding.

[Patent Reference 1]
Japanese Unexamined Patent Application, First Publication No. 2003-167347

DISCLOSURE OF INVENTION

However, conventional positive resist compositions have proven incapable of adequately reducing the level of defects.

The present invention takes the above circumstances into consideration, with an object of providing a positive resist composition that is capable of reducing the level of defects, as well as a method for forming a resist pattern that uses the composition.

In order to achieve the above object, the present invention adopts the aspects described below.

A first aspect of the present invention is a positive resist composition including a resin component (A) that exhibits increased alkali solubility under the action of acid, and an acid generator component (B) that generates acid on exposure, wherein the component (A) is a copolymer (A1) that includes a structural unit (a1) derived from an acrylate that contains an acid dissociable, dissolution inhibiting group, a structural unit (a2) derived from an α-lower alkyl acrylate that contains a lactone ring, and a structural unit (a3) derived from an (α-lower alkyl)acrylate that contains a polar group-containing polycyclic group, and when a resist film is formed from the resist composition on top of a support, the measured value of the contact angle at the surface of the resist film, following application of a developing solution to the surface of the resist film, is no higher than 40 degrees.

A second aspect is a positive resist composition including a resin component (A) that exhibits increased alkali solubility under the action of acid, and an acid generator component (B) that generates acid on exposure, wherein when a resist film is formed from the resist composition on top of a support, the measured value of the contact angle at the surface of the resist film, following application of a developing solution to the surface of the resist film, is no higher than 40 degrees.

A third aspect is a positive resist composition including a resin component (A) that exhibits increased alkali solubility under the action of acid, and an acid generator component (B) that generates acid on exposure, wherein the composition satisfies the conditions (1) and (2) listed below.
(1) The component (A) is a copolymer (A1') that includes a structural unit (a1') derived from an (α-lower alkyl)acrylate that contains an acid dissociable, dissolution inhibiting group, a structural unit (a2') derived from an (α-lower alkyl) acrylate that contains a lactone ring, and a structural unit (a3') derived from an (α-lower alkyl)acrylate that contains a polar group-containing polycyclic group.
(2) When a resist film is formed from the resist composition on top of a support, the measured value of the contact angle at the surface of the resist film, following application of a developing solution to the surface of the resist film, is no higher than 40 degrees.

A fourth aspect of the present invention is a method for forming a resist pattern that includes the steps of applying a positive resist composition according to any of the above first through third aspects to a substrate, conducting a prebake, performing selective exposure, conducting PEB (post exposure baking), and performing alkali developing to form the resist pattern.

In the present invention, the term "(α-lower alkyl)acrylate" is a generic term that includes α-lower alkyl acrylates such as methacrylate, and/or acrylate. The term "α-lower alkyl acrylate" refers to a structure in which the hydrogen atom bonded to the α-carbon atom of an acrylate has been substituted with a lower alkyl group.

The term "structural unit" refers to a monomer unit that contributes to the formation of a polymer.

The expression "structural unit derived from an acrylate" refers to a structural unit that is formed by cleavage of the ethylenic double bond of an acrylate ester.

The expression "structural unit derived from an α-lower alkyl acrylate" refers to a structural unit that is formed by cleavage of the ethylenic double bond of an α-lower alkyl acrylate ester.

The expression "structural unit derived from an (α-lower alkyl)acrylate" refers to a structural unit that is formed by cleavage of the ethylenic double bond of an (α-lower alkyl) acrylate ester.

Furthermore, the term "exposure" is used as a general concept that includes irradiation with any form of radiation.

The present invention is able to provide a positive resist composition that is capable of reducing the level of defects, as well as a method for forming a resist pattern that uses the composition.

BEST MODE FOR CARRYING OUT THE INVENTION

[Positive Resist Composition] <First Aspect>

A positive resist composition of the first aspect includes a resin component (A) that exhibits increased alkali solubility under the action of acid, and an acid generator component (B) that generates acid on exposure, wherein the component (A) is a copolymer (A1) that includes a structural unit (a1) derived from an acrylate that contains an acid dissociable, dissolution inhibiting group, a structural unit (a2) derived from an α-lower alkyl acrylate that contains a lactone ring, and a structural unit (a3) derived from an (α-lower alkyl)acrylate that contains a polar group-containing polycyclic group, and when a resist film is formed from the resist composition on top of a support, the measured value of the contact angle at the surface of the resist film, following application of a developing solution to the surface of the resist film, is no higher than 40 degrees.

In the first aspect, by using a copolymer (A1) in which the hydrogen atom or lower alkyl group bonded to the α-position carbon atom to which the ester group is also bonded is selected independently for the structural unit (a1), the structural unit (a2) and the structural unit (a3), the level of defects can be reduced. Furthermore, the required lithography characteristics can also be obtained.

Copolymer (A1) [Hereafter Also Referred to as Component (A1)]

Structural Unit (a1)

In the structural unit (a1), a hydrogen atom is bonded to the α-carbon atom.

The acid dissociable, dissolution inhibiting group of the structural unit (a1) is a group that exhibits an alkali dissolution inhibiting effect that renders the entire component (A1) alkali-insoluble prior to exposure, but then dissociates under the action of acid generated from the acid generator (B) following exposure, causing the entire component (A1) to change to an alkali-soluble state.

The acid dissociable, dissolution inhibiting group can be selected appropriately from the multitude of such groups proposed for use within resins for resist compositions used with an ArF excimer laser. Typically, groups that form either a cyclic or chain-like tertiary alkyl ester with the carboxyl group of acrylic acid, or groups that form a cyclic or chain-like alkoxyalkyl group are the most widely known.

A cyclic or chain-like alkoxyalkyl ester refers to a structure in which the hydrogen atom of a carboxyl group has been substituted with an alkoxyalkyl group to form an ester, so that the alkoxyalkyl group is bonded to the terminal oxygen atom of the carbonyloxy group (—C(O)—O—), and when an acid acts on this alkoxyalkyl ester, the bond between the oxygen atom and the alkoxyalkyl group is broken. Examples of these types of cyclic or chain-like alkoxyalkyl groups include a 1-methoxymethyl group, 1-ethoxyethyl group, 1-isopropoxyethyl group, 1-cyclohexyloxyethyl group, 2-adamantoxymethyl group, 1-methyladamantoxymethyl group, and 4-oxo-2-adamantoxymethyl group.

Examples of acid dissociable, dissolution inhibiting groups that form a chain-like tertiary alkyl ester include a tert-butyl group or tert-amyl group.

As the structural unit (a1), structural units that include an acid dissociable, dissolution inhibiting group that contains a cyclic group, and particularly an alicyclic group, are preferred. The alicyclic group may be either a monocyclic or a polycyclic group, and can be selected appropriately from the multitude of such groups proposed for use within ArF resists, although from the viewpoint of etching resistance, a polycyclic alicyclic group is preferred. Furthermore, the alicyclic group is preferably a hydrocarbon group, and is preferably saturated.

Examples of suitable monocyclic alicyclic groups include groups in which one hydrogen atom has been removed from a cycloalkane. Examples of suitable polycyclic alicyclic groups include groups in which one hydrogen atom has been removed from a bicycloalkane, tricycloalkane or tetracycloalkane or the like.

Specifically, examples of suitable monocyclic groups include a cyclopentyl group or cyclohexyl group. Examples of suitable polycyclic groups include groups in which one hydrogen atom has been removed from a polycycloalkane such as adamantane, norbornane, isobornane, tricyclodecane or tetracyclododecane.

Of these groups, an adamantyl group in which one hydrogen atom has been removed from adamantane, a norbornyl group in which one hydrogen atom has been removed from norbornane, a tricyclodecanyl group in which one hydrogen atom has been removed from tricyclodecane, and a tetracyclododecanyl group in which one hydrogen atom has been removed from tetracyclododecane are preferred industrially.

More specifically, the structural unit (a1) is preferably at least one unit selected from the general formulas (I), (II) and (III) shown below.

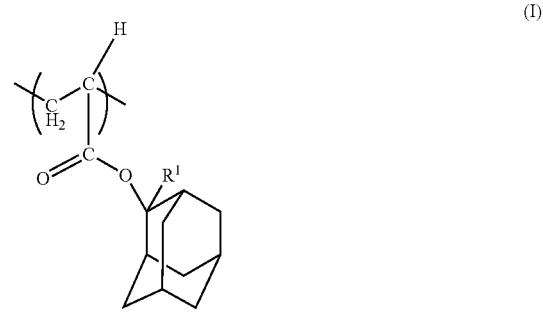

(I)

[In the formula (I), $R^1$ represents a lower alkyl group.]

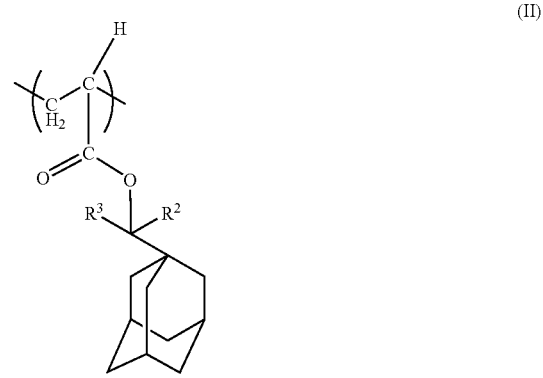

(II)

[In the formula (II), $R^2$ and $R^3$ each represent, independently, a lower alkyl group.]

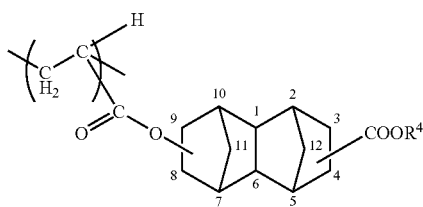
(III)

[In the formula (III), $R^4$ represents a tertiary alkyl group.]

The group $R^1$ is preferably a straight-chain or branched lower alkyl group of 1 to 5 carbon atoms, and specific examples include a methyl group, ethyl group, propyl group, isopropyl group, n-butyl group, isobutyl group, pentyl group, isopentyl group, and neopentyl group. Of these, a methyl group or ethyl group is preferred from the viewpoint of industrial availability.

The groups $R^2$ and $R^3$ each preferably represent, independently, a straight-chain or branched lower alkyl group of 1 to 5 carbon atoms. Of these groups, the case in which $R^2$ and $R^3$ are both methyl groups is preferred industrially, and a structural unit derived from 2-(1-adamantyl)-2-propyl acrylate is a specific example.

The group $R^4$ is preferably a chain-like tertiary alkyl group or a cyclic tertiary alkyl group. Examples of chain-like tertiary alkyl groups include a tert-butyl group or tert-amyl group, although the case in which $R^4$ is a tert-butyl group is preferred industrially. A tertiary alkyl group refers to an alkyl group that includes a tertiary carbon atom.

Examples of cyclic tertiary alkyl groups include the same groups as those exemplified above in relation to the "acid dissociable, dissolution inhibiting group that contains an alicyclic group", and specific examples include a 2-methyl-2-adamantyl group, 2-ethyl-2-adamantyl group, 2-(1-adamantyl)-2-propyl group, 1-ethylcyclohexyl group, 1-ethylcyclopentyl group, 1-methylcyclohexyl group or 1-methylcyclopentyl group.

Furthermore, the group —COOR$^4$ may be bonded to either position 3 or 4 of the tetracyclododecanyl group shown in the formula, although the bonding position cannot be further specified. Furthermore, the carboxyl group residue of the acrylate structural unit may be bonded to either position 8 or 9 of the tetracyclododecanyl group, although similarly, the bonding position cannot be further specified.

The structural unit (a1) may use either a single structural unit, or a combination of two or more different structural units.

The proportion of the structural unit (a1), relative to the combined total of all the structural units that constitute the component (A1), is typically within a range from 20 to 60 mol %, and is preferably from 30 to 50 mol %, and most preferably from 35 to 45 mol %.

By ensuring that this proportion is at least as large as the lower limit of the above range, a favorable pattern can be obtained, whereas ensuring that the proportion is no greater than the upper limit of the above range enables a favorable balance to be achieved with the other structural units.

Structural Unit (a2)

In the structural unit (a2), a lower alkyl group is bonded to the α-carbon atom.

Examples of the structural unit (a2) include structural units in which a monocyclic group formed from a lactone ring or a polycyclic group that includes a lactone ring is bonded to the ester side-chain portion of an α-lower alkyl acrylate. The term lactone ring refers to a single ring containing a —O—C(O)— structure, and this ring is counted as the first ring. Accordingly, in this description, the case in which the only ring structure is the lactone ring is referred to as a monocyclic group, and groups containing other ring structures are described as polycyclic groups regardless of the structure of the other rings.

Specific examples of the structural unit (a2) include monocyclic groups in which one hydrogen atom has been removed from γ-butyrolactone, and polycyclic groups in which one hydrogen atom has been removed from a lactone ring-containing bicycloalkane.

In the structural unit (a2), the lower alkyl group bonded to the α-carbon atom is preferably a straight-chain or branched alkyl group of 1 to 5 carbon atoms, and examples of suitable groups include a methyl group, ethyl group, propyl group, isopropyl group, n-butyl group, isobutyl group, tert-butyl group, pentyl group, isopentyl group, and neopentyl group. A methyl group is preferred industrially.

Specifically, the structural unit (a2) is preferably at least one unit selected from the general formulas (IV) through (VII) shown below.

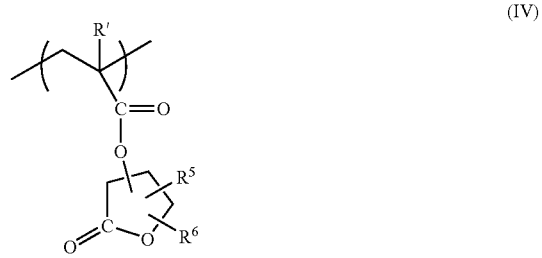
(IV)

[In the formula (IV), R' represents a lower alkyl group, and $R^5$ and $R^6$ each represent, independently, a hydrogen atom or a lower alkyl group.]

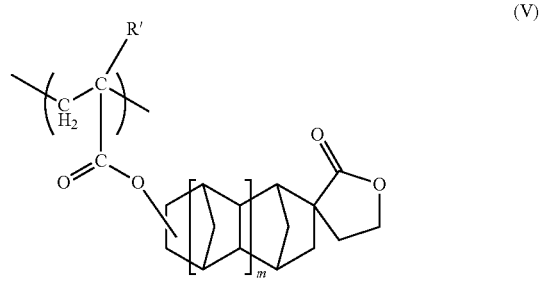
(V)

[In the formula (V), R' represents a lower alkyl group, and m represents either 0 or 1.]

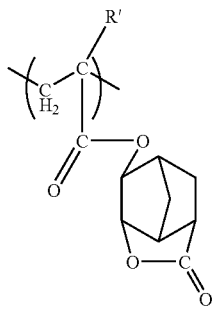
(VI)

[In the formula (VI), R' represents a lower alkyl group.]

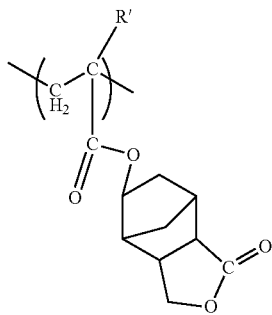
(VII)

[In the formula (VII), R' represents a lower alkyl group.]

The details relating to the lower alkyl group represented by R' are identical to those described above for the lower alkyl group bonded to the α-carbon atom.

In the formula (IV), $R^5$ and $R^6$ each represent, independently, a hydrogen atom or a lower alkyl group, and preferably a hydrogen atom. Suitable lower alkyl groups for the groups $R^5$ and $R^6$ are preferably straight-chain or branched alkyl groups of 1 to 5 carbon atoms, and specific examples include a methyl group, ethyl group, propyl group, isopropyl group, n-butyl group, isobutyl group, tert-butyl group, pentyl group, isopentyl group, and neopentyl group. A methyl group is preferred industrially.

Furthermore, amongst the structural units represented by the general formulas (IV) through (VII), structural units represented by the general formula (IV) are preferred in terms of reducing defects, and of the possible structural units represented by the formula (IV), α-methacryloyloxy-γ-butyrolactone, in which R' is a methyl group, $R^5$ and $R^6$ are both hydrogen atoms, and the position of the ester linkage between the methacrylate ester and the γ-butyrolactone is at the α-position of the lactone ring, is the most desirable.

The structural unit (a2) may use either a single structural unit, or a combination of two or more different structural units.

The proportion of the structural unit (a2), relative to the combined total of all the structural units that constitute the component (A1), is typically within a range from 20 to 60 mol %, and is preferably from 20 to 50 mol %, and most preferably from 30 to 45 mol %. Ensuring that this proportion is at least as large as the lower limit of the above range improves the lithography characteristics, whereas ensuring that the proportion is no greater than the upper limit of the above range enables a favorable balance to be achieved with the other structural units.

Structural Unit (a3)

Including the structural unit (a3) increases the hydrophilicity of the entire component (A1), thereby improving the affinity with the developing solution, improving the alkali solubility within the exposed portions of the resist, and contributing to an improvement in the resolution.

In the structural unit (a3), either a lower alkyl group or a hydrogen atom may be bonded to the α-carbon atom, although a hydrogen atom is preferred. Details of suitable lower alkyl groups are the same as those described above for R'.

Examples of the polar group include a hydroxyl group, cyano group, carboxyl group, or amino group or the like, although a hydroxyl group is particularly preferred.

Examples of the polycyclic group include polycyclic alicyclic hydrocarbon groups (also abbreviated as "polycyclic groups"). The polycyclic group can be selected appropriately from the same multitude of polycyclic groups exemplified above in relation to the structural unit (a1).

Specifically, the structural unit (a3) is preferably at least one unit selected from the general formulas (VIII) through (IX) shown below.

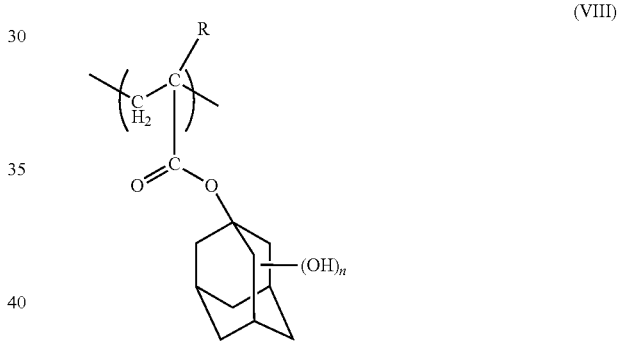
(VIII)

[In the formula (VIII), R represents a hydrogen atom or a lower alkyl group, and n represents an integer from 1 to 3.]

Details of suitable lower alkyl groups represented by R are the same as those described above for R'.

Of these, structural units in which n is 1, and the hydroxyl group is bonded to position 3 of the adamantyl group are preferred.

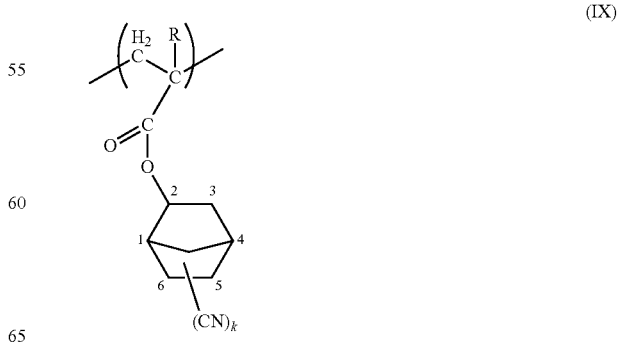
(IX)

[In the formula (IX), R represents a hydrogen atom or a lower alkyl group, and k represents an integer from 1 to 3.]

Details of suitable R groups are the same as those described above for the lower alkyl group or hydrogen atom bonded to the α-carbon atom.

Of these, structural units in which k is 1 are preferred. Furthermore, the cyano group is preferably bonded to position 5 or position 6 of the norbornyl group.

The structural unit (a3) may use either a single structural unit, or a combination of two or more different structural units.

The proportion of the structural unit (a3), relative to the combined total of all the structural units that constitute the component (A1), is typically within a range from 10 to 50 mol %, and is preferably from 15 to 40 mol %, and most preferably from 20 to 30 mol %.

Ensuring that this proportion is at least as large as the lower limit of the above range improves the lithography characteristics, whereas ensuring that the proportion is no greater than the upper limit of the above range enables a favorable balance to be achieved with the other structural units.

Other Structural Units

The component (A1) may include structural units other than the aforementioned structural units (a1) through (a3), but the combined total of these structural units (a1) through (a3), relative to the combined total of all the structural units, is typically at least 70 mol %, and is preferably 80 mol % or greater, and most preferably 100 mol %.

A structural unit (a4) besides the structural units (a1) through (a3) may be any other structural unit that cannot be classified as one of the above structural units (a1) through (a3), and there are no particular restrictions.

For example, structural units that contain a polycyclic alicyclic hydrocarbon group, and are derived from an (α-lower alkyl)acrylate are preferred. Examples of the polycyclic alicyclic hydrocarbon group include, for example, the same multitude of groups listed above in relation to the structural unit (a1), and of these, in terms of industrial availability and the like, one or more groups selected from amongst a tricyclodecanyl group, adamantyl group, tetracyclododecanyl group, norbornyl group, and isobornyl group is preferred.

Specific examples of the structural unit (a4) include units of the structures (X) to (XII) shown below.

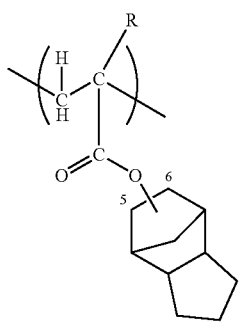
(X)

(wherein, R represents a hydrogen atom or a lower alkyl group)

This structural unit typically exists as a mixture of the isomers in which the bonding position is either position 5 or position 6.

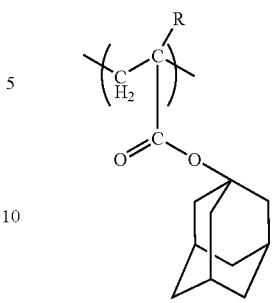
(XI)

(wherein, R represents a hydrogen atom or a lower alkyl group)

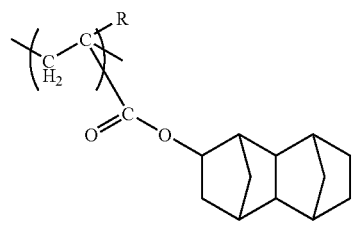
(XII)

(wherein, R represents a hydrogen atom or a lower alkyl group)

In those cases where a structural unit (a4) is included, the proportion of the structural unit (a4), relative to the combined total of all the structural units that constitute the component (A1), is typically within a range from 1 to 25 mol %, and is preferably from 5 to 20 mol %.

Furthermore, the component (A1) is preferably a copolymer that includes at least the structural units represented by the chemical formulas shown below, and is even more preferably a copolymer formed solely from these structural units.

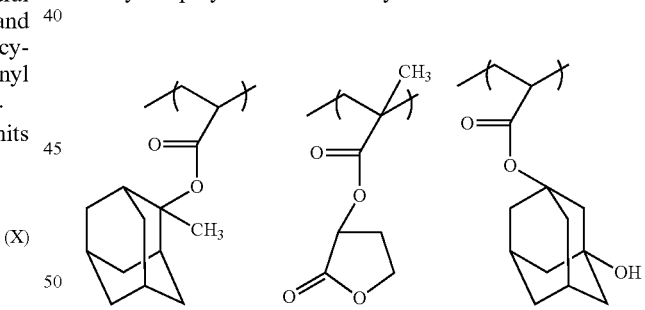

The component (A1) may include either a single resin, or a mixture of two or more different resins.

Furthermore, the component (A1) can be obtained, for example, by a conventional radical polymerization or the like of the monomers corresponding with each of the structural units, using a radical polymerization initiator such as azobisisobutyronitrile (AIBN).

Although there are no particular restrictions on the weight average molecular weight (the polystyrene equivalent weight average molecular weight determined by gel permeation chromatography, this also applies below) of the component (A1), the value is typically no more than approximately 30,000, and is preferably no more than 20,000, even more preferably 12,000 or lower, and is most preferably 10,000 or lower.

There are no particular restrictions on the lower limit, although from the viewpoints of inhibiting pattern collapse and achieving a favorable improvement in resolution and the like, the weight average molecular weight is preferably at least 4,000, and even more preferably 5,000 or greater.

Component (B)

The component (B) can use any of the known acid generators used in conventional chemically amplified resist compositions without any particular restrictions.

Examples of the types of acid generators that have been used are numerous, and include onium salt-based acid generators such as iodonium salts and sulfonium salts, oxime sulfonate-based acid generators, diazomethane-based acid generators such as bisalkyl or bisaryl sulfonyl diazomethanes, and poly(bis-sulfonyl)diazomethanes, iminosulfonate-based acid generators, and disulfone-based acid generators.

Specific examples of suitable onium salt-based acid generators include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, (4-methoxyphenyl) diphenylsulfonium trifluoromethanesulfonate, heptafluoropropanesulfonate or nonafluorobutanesulfonate, and tri(4-tert-butyl)phenylsulfonium trifluoromethanesulfonate, heptafluoropropanesulfonate or nonafluorobutanesulfonate.

Specific examples of suitable oxime sulfonate-based acid generators include α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile. Of these, α-(methylsulfonyloxyimino)-p-methoxyphenyl acetonitrile is preferred.

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Furthermore, specific examples of poly(bis-sulfonyl)diazomethanes include the structures shown below, such as 1,3-bis(phenylsulfonyldiazomethylsulfonyl)propane (compound A), 1,4-bis(phenylsulfonyldiazomethylsulfonyl)butane (compound B), 1,6-bis(phenylsulfonyldiazomethylsulfonyl)hexane (compound C), 1,10-bis(phenylsulfonyldiazomethylsulfonyl)decane (compound D), 1,2-bis(cyclohexylsulfonyldiazomethylsulfonyl)ethane (compound E), 1,3-bis(cyclohexylsulfonyldiazomethylsulfonyl)propane (compound F), 1,6-bis(cyclohexylsulfonyldiazomethylsulfonyl)hexane (compound G), and 1,10-bis(cyclohexylsulfonyldiazomethylsulfonyl)decane (compound H).

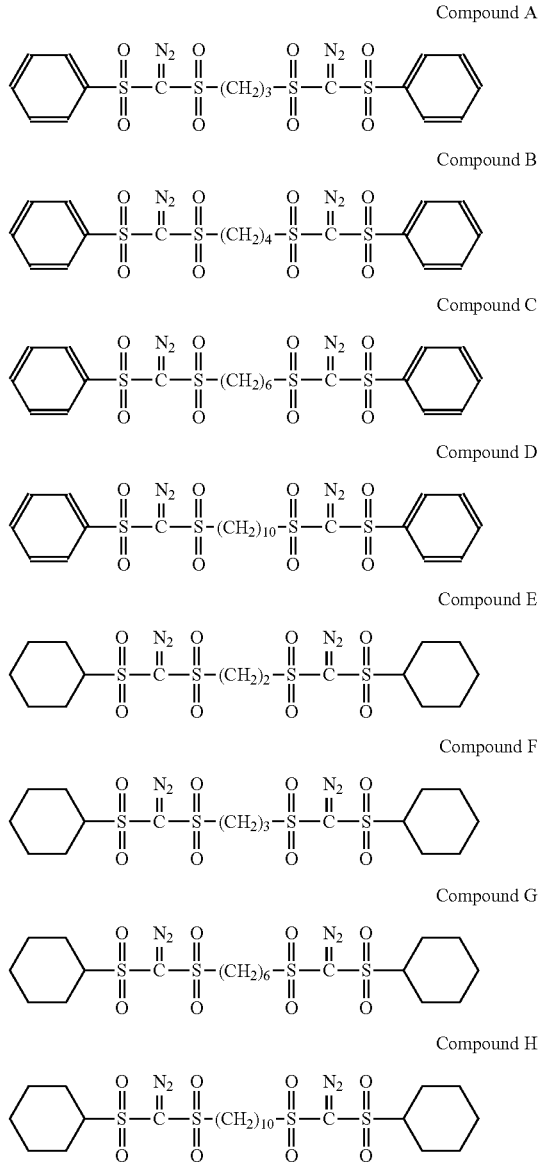

In the present invention, of the above possibilities, the component (B) preferably uses an onium salt with a fluorinated alkylsulfonate ion as the anion.

As the component (B), the use of at least one sulfonium compound selected from the group consisting of structural units represented by general formulas (b-1) and (b-2) shown below is also preferred.

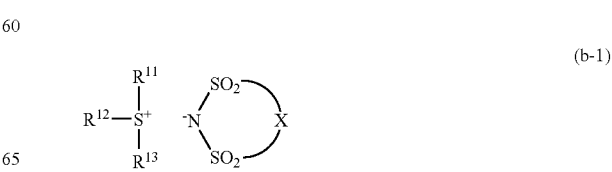

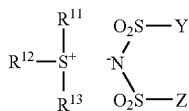

[In these formulas, X represents an alkylene group of 2 to 6 carbon atoms in which at least one hydrogen atom has been substituted with a fluorine atom; Y and Z each represent, independently, an alkyl group of 1 to 10 carbon atoms in which at least one hydrogen atom has been substituted with a fluorine atom; and $R^{11}$ to $R^{13}$ each represent, independently, an aryl group or an alkyl group, although at least one of the groups $R^{11}$ to $R^{13}$ is an aryl group.]

In the formulas (b-1) and (b-2), the group X is a straight-chain or branched alkylene group in which at least one hydrogen atom has been substituted with a fluorine atom, and the number of carbon atoms within the alkylene group is typically within a range from 2 to 6, and preferably from 3 to 5, and is most preferably 3.

Y and Z each represent, independently, a straight-chain or branched alkyl group in which at least one hydrogen atom has been substituted with a fluorine atom, and the number of carbon atoms within the alkyl group is typically within a range from 1 to 10, and preferably from 1 to 7, and most preferably from 1 to 3.

Lower numbers of carbon atoms within the alkylene group X or the alkyl groups Y and Z result in better solubility within the resist solvent, which is desirable.

Furthermore, in the alkylene group X or the alkyl groups Y and Z, the larger the number of hydrogen atoms that have been substituted with fluorine atoms, the stronger the acid becomes, and the transparency relative to high energy light beams of 200 nm or less or electron beams also improves favorably. The fluorine atom proportion within the alkylene group or alkyl groups, namely the fluorination ratio, is preferably within a range from 70 to 100%, and even more preferably from 90 to 100%, and perfluoroalkylene or perfluoroalkyl groups in which all of the hydrogen atoms have been substituted with fluorine atoms are the most desirable.

$R^{11}$ to $R^{13}$ each represent, independently, an aryl group or an alkyl group.

Of the groups $R^{11}$ to $R^{13}$, at least one group represents an aryl group. Compounds in which at least two of $R^{11}$ to $R^{13}$ represent aryl groups are preferred, and compounds in which all of $R^{11}$ to $R^{13}$ are aryl groups are the most preferred.

There are no particular restrictions on the aryl groups of $R^{11}$ to $R^{13}$, and suitable examples include aryl groups of 6 to 20 carbon atoms, such as phenyl groups and naphthyl groups, which may, or may not, be substituted with alkyl groups, alkoxy groups, and/or halogen atoms and the like. In terms of enabling low cost synthesis, aryl groups of 6 to 10 carbon atoms are preferred.

There are no particular restrictions on the alkyl groups of $R^{11}$ to $R^{13}$, and suitable examples include straight-chain, branched, or cyclic alkyl groups of 1 to 10 carbon atoms. From the viewpoint of achieving excellent resolution, alkyl groups of 1 to 5 carbon atoms are preferred. Specific examples include a methyl group, ethyl group, n-propyl group, isopropyl group, n-butyl group, isobutyl group, n-pentyl group, cyclopentyl group, hexyl group, cyclohexyl group, nonyl group, and decanyl group, although in terms of achieving superior resolution and enabling low cost synthesis, a methyl group is the most desirable.

Of the above possibilities, compounds in which $R^{11}$ to $R^{13}$ are all phenyl groups are the most preferred.

These sulfonium compounds can be used either alone, or in combinations of two or more different compounds.

The component (B) may use either a single acid generator, or a combination of two or more different acid generators.

The quantity used of the component (B) is typically within a range from 0.5 to 30 parts by weight, and preferably from 1 to 10 parts by weight, per 100 parts by weight of the component (A). At quantities less than the above range, there is a danger that pattern formation may not proceed satisfactorily, whereas if the quantity exceeds the above range, achieving a uniform solution becomes difficult, and there is a danger of a deterioration in the storage stability.

In a positive resist composition of the present invention, in order to improve the resist pattern shape and the post exposure stability of the latent image formed by the pattern-wise exposure of the resist layer, a nitrogen-containing organic compound (D) (hereafter referred to as the component (D)) can be added as an optional component.

Nitrogen-Containing Organic Compound (D)

A multitude of these components (D) have already been proposed, and any of these known compounds can be used, although an amine, and particularly a secondary lower aliphatic amine or tertiary lower aliphatic amine is preferred.

Here, a lower aliphatic amine refers to an alkyl or alkyl alcohol amine of no more than 5 carbon atoms, and examples of these secondary and tertiary amines include trimethylamine, diethylamine, triethylamine, di-n-propylamine, tri-n-propylamine, tripentylamine, diethanolamine, triethanolamine and triisopropanolamine, and of these, tertiary alkanolamines such as triethanolamine and triisopropanolamine are particularly preferred.

These compounds may be used either alone, or in combinations of two or more different compounds.

The component (D) is typically used in a quantity within a range from 0.01 to 5.0 parts by weight per 100 parts by weight of the component (A).

Furthermore, in order to prevent any deterioration in sensitivity caused by the addition of the aforementioned component (D), and improve the resist pattern shape and the post exposure stability of the latent image formed by the pattern-wise exposure of the resist layer, an organic carboxylic acid, or a phosphorus oxo acid or derivative thereof can also be added as another optional component (E) (hereafter referred to as the component (E)). The component (D) and the component (E) can be used in combination, or either one can also be used alone.

Component (E)

For the component (E), examples of suitable organic carboxylic acids include malonic acid, citric acid, malic acid, succinic acid, benzoic acid, and salicylic acid.

For the component (E), examples of suitable phosphorus oxo acids or derivatives thereof include phosphoric acid or derivatives thereof such as esters, including phosphoric acid, di-n-butyl phosphate, and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly preferred.

The component (E) is typically used in a quantity within a range from 0.01 to 5.0 parts by weight per 100 parts by weight of the component (A).

Organic Solvent

A positive resist composition of the present invention can be produced by dissolving the materials in an organic solvent.

The organic solvent may be any solvent capable of dissolving the various components to generate a uniform solution, and one or more solvents selected from known materials used as the solvents for conventional chemically amplified resists can be used.

Specific examples of the solvent include ketones such as γ-butyrolactone, acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate (EL), methyl acetate, ethyl acetate, butyl acetate, methyl pyruvate, ethyl pyruvate, methyl methoxypropionate, and ethyl ethoxypropionate.

These organic solvents can be used either alone, or as a mixed solvent of two or more different solvents.

Furthermore, mixed solvents of propylene glycol monomethyl ether acetate (PGMEA) and a polar solvent are preferred. Although the blend ratio (weight ratio) in such mixed solvents can be set in accordance with factors such as the co-solubility of the PGMEA and the polar solvent, the ratio is preferably within a range from 1:9 to 9:1, and even more preferably from 2:8 to 8:2.

More specifically, in those cases where EL is added as the polar solvent, the weight ratio PGMEA:EL is preferably within a range from 2:8 to 8:2, and even more preferably from 3:7 to 7:3.

Furthermore, as the organic solvent, mixed solvents containing at least one of PGMEA and EL, together with γ-butyrolactone, are also preferred. In such cases, the weight ratio of the former and latter components in the mixed solvent is preferably within a range from 70:30 to 95:5.

There are no particular restrictions on the quantity used of the organic solvent, although the quantity should provide a concentration that enables favorable application of the solution to a substrate or the like, should be set in accordance with the required coating film thickness, and is typically set so that the solid fraction concentration within the resist composition falls within a range from 2 to 20% by weight, and even more preferably from 5 to 15% by weight.

Other Optional Components

Other miscible additives can also be added to a positive resist composition of the present invention according to need, and examples include additive resins for improving the properties of the resist film, surfactants for improving the ease of application, dissolution inhibitors, plasticizers, stabilizers, colorants, halation prevention agents, and dyes.

Furthermore, in the first aspect of the present invention, when a resist film is formed from the above resist composition on top of a support, the measured value of the contact angle at the surface of the resist film, following application of a developing solution to the surface of the resist film, is preferably no higher than 40 degrees. In other words, the first aspect, the second aspect, and the third aspect preferably all satisfy the requirement for a specific contact angle. Although there are no particular restrictions, the contact angle is also preferably at least 25 degrees, and even more preferably 30 degrees or greater. By ensuring that the contact angle satisfies this range, the level of defects can be reduced even further. Furthermore, the lithography characteristics also improve. A preferred contact angle value is within a range from 30 to 40 degrees, even more preferably from 32 to 40 degrees, even more preferably from 35 to 40 degrees, and most preferably from 36 to 39 degrees.

The contact angle can be altered by adjusting the nature and blend quantities of the structural units within the component (A1), or by adjusting the nature and blend quantities of other components such as the component (B) as is described in further detail below.

The method of measuring the contact angle is described in detail in the description relating to the second aspect.

By using a positive resist composition according to the first aspect, the level of defects can be reduced. Furthermore, the required lithography characteristics can also be obtained. Moreover, the sensitivity also improves.

Furthermore, the required lithography characteristics can also be obtained using a shrink process described below.

Moreover, in this shrink process, narrowing can be conducted with the temperature during the shrink step set to a lower temperature than is conventionally employed, which is particularly favorable in terms of the apparatus and the handling.

In the first aspect, the reason that a reduction in defects is achieved is not entirely clear, although it is believed to reflect the fact that the above configuration produces a resist film in which the contact angle at the surface tends to be lower.

In other words, a resist pattern is obtained by applying the positive resist composition to a substrate, conducting a prebake (PAB (post applied bake)), performing selective exposure, and then conducting PEB (post exposure baking) and performing alkali developing, but in the alkali developing step, following dissolution and removal of the exposed portions of the resist using the alkali developing solution, any residual developing solution and the like is usually removed by rinsing with pure water.

During this rinse, because the positive resist composition of this first aspect generates a resist film that exhibits a small contact angle at the resist surface, meaning the surface is readily wet (has a high level of hydrophilicity), it is thought that the affinity with comparatively hydrophobic solid components that can cause defects (including those components that re-precipitate during rinsing), such as deposits that contain resin components and residual substances that are left undissolved by the developing solution, is reduced, meaning these deposits and residual substances can be readily removed from the resist film surface during the alkali developing and rinsing steps, thereby leading to a reduction in the level of defects.

<Second Aspect and Third Aspect>

(Second Aspect)

The second aspect is a positive resist composition including a resin component (A) that exhibits increased alkali solubility under the action of acid, and an acid generator component (B) that generates acid on exposure, wherein when a resist film is formed from the resist composition on top of a support, the measured value of the contact angle at the surface of the resist film, following application of a developing solution to the surface of the resist film, is no higher than 40 degrees.

By ensuring that the measured value of the contact angle is no higher than 40 degrees, the level of defects can be reduced.

The lower limit for the contact angle is typically at least 25 degrees, and preferably 30 degrees or greater.

More specifically, the measured value of the contact angle is preferably within a range from 30 to 40 degrees, even more preferably from 32 to 40 degrees, even more preferably from 35 to 40 degrees, and most preferably from 36 to 39 degrees.

By ensuring the angle is at least 35 degrees, favorable lithography characteristics such as a favorable DOF (depth of focus) can be achieved together with the reduction in defects.

The most preferred range for the measured value of the contact angle is from 36 to 39 degrees.

The contact angle is measured in the manner described below.

1) 1 ml of a resist composition solution with a solid fraction concentration of 8% by weight is spin coated at a rate of revolution of 1,500 rpm onto the surface of a silicon substrate with a diameter of 6 inches, and is then heated for 90 seconds at a temperature of 90° C.

2) Using a developing apparatus [product name: TD6133U (manufactured by Tazmo Co., Ltd.)], a 2.38% by weight aqueous solution of tetramethylammonium hydroxide (the alkali developing solution) is dripped onto the surface of the above resist film at a temperature of 23° C. for a period of 30 seconds, and the resist film is then spun dry for 20 seconds at a revolution rate of 1,500 rpm.

3) Using a FACE contact angle meter CA-X150 (a product name, manufactured by Kyowa Interface Science Co., Ltd.), the injector fitted to the apparatus is brought into contact with the dried resist film (on contact between the injector and the resist film, 2 μL of pure water is released onto the resist film surface), and the contact angle is measured.

Component (A)

Furthermore, in the second aspect, the component (A) preferably contains a structural unit (a1') derived from an (α-lower alkyl)acrylate that contains an acid dissociable, dissolution inhibiting group, and a structural unit (a2') derived from an (α-lower alkyl)acrylate that contains a lactone ring.

Structural Unit (a1')

This structural unit is the same as that described below for the third aspect. A preferred proportion for the structural unit (a1') within the component (A) is the same as the proportion of the structural unit (a1') within the copolymer (A1') according to the third aspect described below.

Structural Unit (a2')

This structural unit is the same as that described below for the third aspect. A preferred proportion for the structural unit (a2') within the component (A) is the same as the proportion of the structural unit (a2') within the copolymer (A1') according to the third aspect described below.

Although there are no particular restrictions on the manner in which the structural unit (a1') and the structural unit (a2') are included, inclusion of the structural units within a copolymer is preferred.

Furthermore, the component (A) is preferably a copolymer (A1') that includes the structural unit (a1'), the structural unit (a2'), and a structural unit (a3') derived from an (α-lower alkyl)acrylate that contains a polar group-containing polycyclic group.

Copolymer (A1')

As described for the third aspect.

Component (B)

As described for the first aspect.

Component (D)

As described for the first aspect.

Component (E)

As described for the first aspect.

Organic Solvent

As described for the first aspect.

Other Optional Components

As described for the first aspect.

In the second aspect, the contact angle can be adjusted to a value within the preferred range using, for example, the methods described below.

(Method 1)

If a copolymer is used in which, as per the first aspect, the structural unit (a1) is used as the structural unit (a1') and the structural unit (a2) is used as the structural unit (a2'), then the value of the contact angle can easily be adjusted to a value of 40 degrees or lower. Moreover, the use of a copolymer (A) that includes a structural unit (a3) as well as the structural unit (a1) and the structural unit (a2) is particularly preferred.

(Method 2)

The value of the contact angle of the resist composition can also be adjusted to a value of 40 degrees or lower by mixing together a plurality of copolymers that each contain the same structural units.

Even with copolymers that contain the same structural units, (i) if the proportions of the structural units within each copolymer differ, then the measured value of the contact angle for the mixture will differ from the values for the resist compositions that use only one of the copolymers as the base resin.

Here, the expression "the same structural units" refers to structural units of the same chemical structure.

Furthermore, (ii) even in the case of a plurality of copolymers that contain the same structural units in the same proportions, changes in the production lot can result in a measured value for the contact angle that differs from the values for the resist compositions that use only one of the copolymers as the base resin. It is surmised that this observation probably reflects the fact that minor changes in the production conditions such as the temperature and the pressure cause bias within the distribution of the structural units that constitute the copolymer.

Accordingly, by using, as the base resin, a mixed resin containing a copolymer that yields a resist composition with a large value for the contact angle, and a copolymer that exhibits a small value for the contact angle, a resist composition with a contact angle no higher than 40 degrees can be obtained.

As follows is a description of a specific example.

In this example, a first copolymer and a second copolymer are used.

These copolymers are formed using the same structural units, and the proportion of each of the structural units is the same within each copolymer, but the production lots for the copolymers are different.

First, factors relating to the composition of the target resist composition, other than the mixing proportions of the first copolymer and the second copolymer, are determined.

Subsequently, the target resist composition is produced as a first resist composition in which the component (A) of the base resin is formed from 100% by weight of the first copolymer.

The contact angle for this first resist composition is then measured in the manner described above. This measured value is deemed X1.

Similarly, using the second copolymer, a second resist composition is produced in which the component (A) of the base resin is formed from 100% by weight of the second copolymer.

The contact angle for this second resist composition is also measured in the manner described above. This measured value is deemed X2.

The respective mixing proportions of the first copolymer and the second copolymer within a resist composition formed using a component (A) that contains a mixture of both copolymers are then calculated so that the measured value for the contact angle of the mixed resist composition is no higher than 40 degrees.

In other words, the proportions Y1 and Y2 are determined so as to satisfy the formula shown below.

$$[X1(°) \times Y1(\text{weight \%}) + X2(°) \times Y2(\text{weight \%})]/100 \leq 40(°)$$

Y1 is the proportion (weight %) of the first copolymer within the component (A), and Y2 is the proportion (weight %) of the second copolymer within the component (A), wherein Y1+Y2=100.

If a resist composition is produced using a component (A) in which the first copolymer and the second copolymer are mixed together using these proportions, then a resist composition can be obtained for which the measured value of the contact angle is no higher than 40 degrees.

The plurality of copolymers that are mixed together preferably contain the same structural units.

Amongst this plurality of copolymers, although the respective proportions of the various structural units may vary, using copolymers with the same proportions of the various structural units enables more ready control of the contact angle, and is consequently preferred.

Furthermore, there are no particular restrictions on the number of copolymers that are mixed, which may be any number of 2 or greater, although the number is preferably from 2 to 3, and is most preferably 2.

The contact angle values for the plurality of copolymers that undergo mixing preferably include at least one copolymer for which the measured value of the contact angle is at least 40 degrees, and one copolymer for which the measured value of the contact angle is less than 40 degrees. The contact angle for the former copolymer is even more preferably greater than 40 degrees, and is most preferably within a range from 42 to 50 degrees. The contact angle for the latter copolymer is most preferably within a range from 30 to 34 degrees.

When measuring the contact angles for the purpose of determining the respective copolymer mixing proportions, as described above, the make-up of the compositions besides the nature of the component (A) is preferably set in the manner described below in example 1, and the contact angle is then measured for the thus prepared resist compositions.

If the same composition as the example 1 is employed, the contact angles are measured, and the respective mixing proportions for the copolymers within the component (A) are determined, then if, for example, factors other than the nature of the component (A) are altered slightly in order to formulate a composition that is ideal for an ArF excimer laser, the effects of the present invention can still be realized. As a result, the mixing proportions of the copolymers within the component (A) can be determined relatively easily.

(Method 3)

The contact angle can be altered by adjusting the nature and blend quantities of the structural units of the copolymer (A1'), or by adjusting the nature and blend quantities of the other components such as the component (B). Suitable methods include: increasing the blend quantities of structural units with hydrophilic regions, such as the structural unit (a2') and the structural unit (a3'); selecting an acid generator that contains a hydrophilic group as the component (B); and adding a compound that contains a hydrophilic group as an additive.

The second aspect enables a reduction in the level of defects to be achieved.

In the second aspect, the reason that a reduction in defects is achieved is not entirely clear, but the following reasoning is thought likely.

Namely, a resist pattern is obtained by applying the positive resist composition to a substrate, conducting a prebake, performing selective exposure, and then conducting PEB (post exposure baking) and performing alkali developing, but in the alkali developing step, following dissolution and removal of the exposed portions of the resist using the alkali developing solution, any residual developing solution and the like is usually removed by rinsing with pure water.

During this rinse, because the positive resist composition of this second aspect generates a resist film that exhibits a small contact angle at the resist surface, meaning the surface is readily wet (has a high level of hydrophilicity), it is thought that the affinity with comparatively hydrophobic solid components that can cause defects (including those components that re-precipitate during rinsing), such as deposits that contain resin components and residual substances that are left undissolved by the developing solution, is reduced, meaning these deposits and residual substances can be readily removed from the resist film surface during the alkali developing and rinsing steps, thereby leading to a reduction in the level of defects.

(Third Aspect)

A positive resist composition of the third aspect includes a resin component (A) that exhibits increased alkali solubility under the action of acid, and an acid generator component (B) that generates acid on exposure, wherein the composition satisfies the conditions (1) and (2) listed below.

(1) The component (A) is a copolymer (A1') that includes a structural unit (a1') derived from an (α-lower alkyl)acrylate that contains an acid dissociable, dissolution inhibiting group, a structural unit (a2') derived from an (α-lower alkyl) acrylate that contains a lactone ring, and a structural unit (a3') derived from an (α-lower alkyl)acrylate that contains a polar group-containing polycyclic group.

(2) When a resist film is formed from the resist composition on top of a support, the measured value of the contact angle at the surface of the resist film, following application of a developing solution to the surface of the resist film, is no higher than 40 degrees.

Copolymer (A1') [hereafter also referred to as Component (A1')]

Structural Unit (a1')

The structural unit (a1') corresponds with the structural unit (a1) described in relation to the aforementioned component (A1). The structural unit (a1') differs from the structural unit (a1) in that the body bonded to the α-carbon atom is not restricted to a hydrogen atom, but may be either a hydrogen atom or a lower alkyl group.

Accordingly, with the exception of the body bonded to the α-carbon atom, details relating to the structural unit (a1') [such as preferred configurations, and the blend quantity within the copolymer (A1')] can be the same as those described for the structural unit (a1).

Examples of lower alkyl groups that can be bonded to the α-carbon atom include the same lower alkyl groups as those bonded to the α-carbon atom within the aforementioned structural unit (a2).

In the structural unit (a1'), a hydrogen atom is preferably bonded to the α-carbon atom.

Furthermore, the structural unit (a1') is preferably at least one unit selected from the general formulas (I') through (III') shown below.

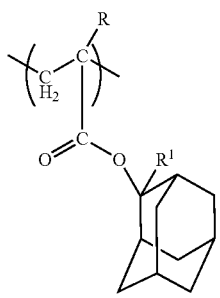

(I')

[In the formula (I'), R represents a hydrogen atom or a lower alkyl group, and $R^1$ represents a lower alkyl group.]

R and $R^1$ are as defined above.

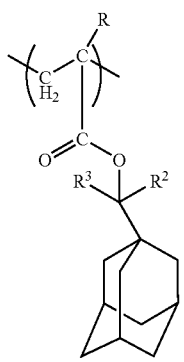

(II')

[In the formula (II'), R represents a hydrogen atom or a lower alkyl group, and $R^2$ and $R^3$ each represent, independently, a lower alkyl group.]

R, $R^2$ and $R^3$ are as defined above.

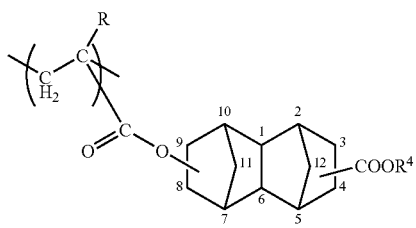

(III')

[In the formula (III'), R represents a hydrogen atom or a lower alkyl group, and $R^4$ represents a tertiary alkyl group.]

R and $R^4$ are as defined above.

Structural Unit (a2')

The structural unit (a2') corresponds with the structural unit (a2) described in relation to the aforementioned component (A1). The structural unit (a2') differs from the structural unit (a2) in that the group bonded to the α-carbon atom is not restricted to a lower alkyl group, but may be either a hydrogen atom or a lower alkyl group.

Accordingly, with the exception of the body bonded to the α-carbon atom, details relating to the structural unit (a2') [such as preferred configurations, and the blend quantity within the copolymer (A1')] can be the same as those described for the structural unit (a2).

Examples of lower alkyl groups that can be bonded to the α-carbon atom include the same lower alkyl groups as those bonded to the α-carbon atom within the aforementioned structural unit (a2).

In the structural unit (a2'), a lower alkyl group is preferably bonded to the α-carbon atom.

Furthermore, the structural unit (a2') is preferably at least one unit selected from the general formulas (IV') through (VII') shown below.

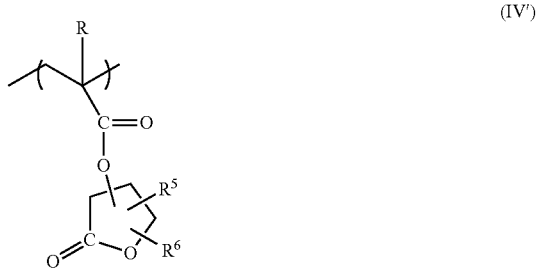

(IV')

[In the formula (IV'), R represents a hydrogen atom or a lower alkyl group, and $R^5$ and $R^6$ each represent, independently, a hydrogen atom or a lower alkyl group.]

R, $R^5$ and $R^6$ are as defined above.

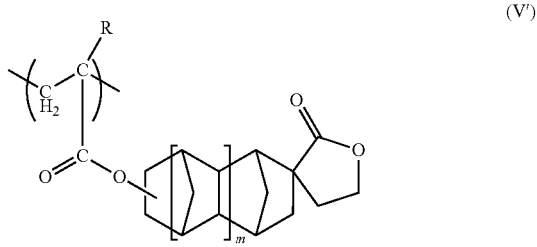

(V')

[In the formula (V'), R represents a hydrogen atom or a lower alkyl group, and m is either 0 or 1.]

R and m are as defined above.

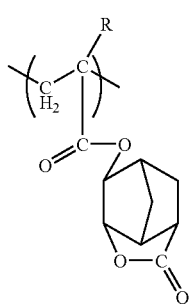

(VI')

[In the formula (VI'), R represents a hydrogen atom or a lower alkyl group.]

R is as defined above.

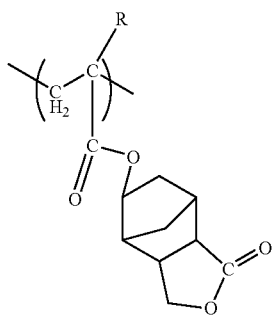

(VII')

[In the formula (VII'), R represents a hydrogen atom or a lower alkyl group.]

R is as defined above.

Structural Unit (a3')

The structural unit (a3') is the same as the structural unit (a3).

Accordingly, factors such as preferred configurations for the structural unit and the blend quantity within the copolymer (A1') can be the same as those described for the structural unit (a3).

As described above for the structural unit (a3), the structural unit (a3') is preferably at least one unit selected from the general formulas (VIII') through (IX') shown below.

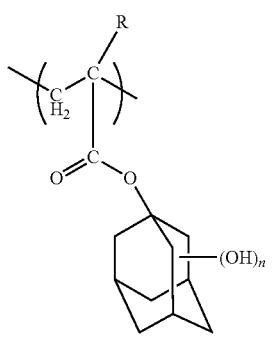

(VIII')

[In the formula (VIII'), R represents a hydrogen atom or a lower alkyl group, and n represents an integer from 1 to 3.]

Details of the formula (VIII') are as described above for the formula (VIII).

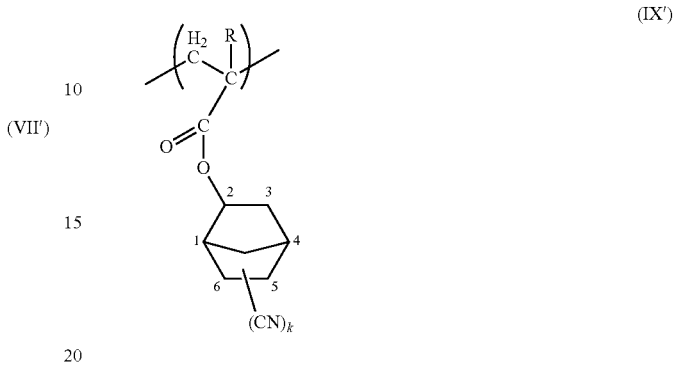

(IX')

[In the formula (IX'), R represents a hydrogen atom or a lower alkyl group, and k represents an integer from 1 to 3.]

Details of the formula (IX') are as described above for the formula (IX).

Other Structural Units

The component (A1') may include structural units other than the aforementioned structural units (a1') through (a3'), but the combined total of these structural units (a1') through (a3'), relative to the combined total of all the structural units, is typically at least 70 mol %, and is preferably 80 mol % or greater, and most preferably 100 mol %.

A structural unit (a4') besides the structural units (a1') through (a3') may be any other structural unit that cannot be classified as one of the above structural units (a1') through (a3'), and there are no particular restrictions.

The structural unit (a4') corresponds with the structural unit (a4) described in relation to the aforementioned component (A1), and can employ the same types of structural units.

Furthermore, the component (A1') is preferably a copolymer that includes at least the structural units represented by the chemical formulas shown below, and is even more preferably a copolymer formed solely from these structural units.

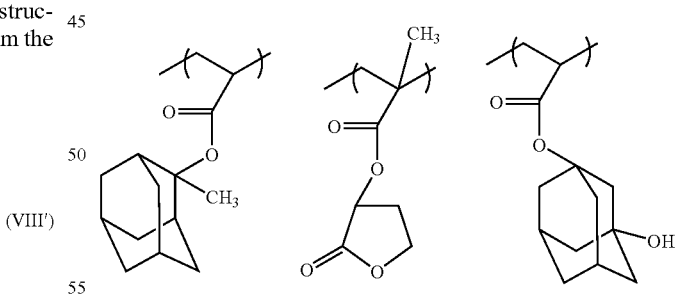

Furthermore, in the third aspect, a composition that also satisfies the conditions of the first aspect is particularly desirable.

In other words, cases in which the structural unit (a1') is a structural unit derived from an acrylate ester and the structural unit (a2') is a structural unit derived from an α-lower alkyl acrylate are particularly desirable. Such configurations enable the contact angle to be readily adjusted, while also providing an improvement in the defect suppression effect.

The component (A1') may include either a single resin, or a mixture of two or more different resins.

Furthermore, the component (A1') can be obtained, for example, by a conventional radical polymerization or the like of the monomers corresponding with each of the structural units, using a radical polymerization initiator such as azobisisobutyronitrile (AIBN).

Although there are no particular restrictions on the weight average molecular weight (the polystyrene equivalent weight average molecular weight determined by gel permeation chromatography, this also applies below) of the component (A1'), the value is typically no more than approximately 30,000, and is preferably no more than 20,000, even more preferably 12,000 or lower, and is most preferably 10,000 or lower.

There are no particular restrictions on the lower limit, although from the viewpoints of inhibiting pattern collapse and achieving a favorable improvement in resolution and the like, the weight average molecular weight is preferably at least 4,000, and even more preferably 5,000 or greater.

The weight average molecular weight (the polystyrene equivalent weight average molecular weight determined by gel permeation chromatography, this also applies below) of the component is typically 12,000 or lower, and is preferably 10,000 or lower.

There are no particular restrictions on the lower limit, although from the viewpoints of inhibiting pattern collapse and achieving a favorable improvement in resolution and the like, the weight average molecular weight is preferably at least 4,000, and even more preferably 5,000 or greater.

Component (B)

As described for the first aspect.

Component (D)

As described for the first aspect.

Component (E)

As described for the first aspect.

Organic Solvent

As described for the first aspect.

Other Optional Components

As described for the first aspect.

In the third aspect of the present invention, when a resist film is formed from the above resist composition on top of a support, the measured value of the contact angle at the surface of the resist film, following application of a developing solution to the surface of the resist film, is preferably no higher than 40 degrees. Although there are no particular restrictions, the contact angle is also preferably at least 25 degrees, and even more preferably 30 degrees or greater. By ensuring that the contact angle is no higher than 40 degrees, the level of defects can be reduced. The measured value for the contact angle is preferably within a range from 30 to 40 degrees, even more preferably from 32 to 40 degrees, even more preferably from 35 to 40 degrees, and most preferably from 36 to 39 degrees.

The contact angle can be altered by adjusting the nature and blend quantities of the structural units of the copolymer (A1'), or by adjusting the nature and blend quantities of the other components such as the component (B). Suitable methods include: increasing the blend quantities of structural units with hydrophilic regions, such as the structural unit (a2') and the structural unit (a3'); selecting an acid generator that contains a hydrophilic group as the component (B); and adding a compound that contains a hydrophilic group as an additive. If the conditions of the first aspect are also satisfied, then adjustment of the contact angle is comparatively simple.

Conditions for Measuring Contact Angle

The contact angle is measured in the manner described below.

1) 1 ml of a resist composition solution with a solid fraction concentration of 8% by weight is spin coated at a rate of revolution of 1,500 rpm onto the surface of a silicon substrate with a diameter of 6 inches, and is then heated for 90 seconds at a temperature of 90° C.

2) Using a developing apparatus [product name: TD6133U (manufactured by Tazmo Co., Ltd.)], a 2.38% by weight aqueous solution of tetramethylammonium hydroxide (the alkali developing solution) is dripped onto the surface of the above resist film at a temperature of 23° C. for a period of 30 seconds, and the resist film is then spun dry for 20 seconds at a revolution rate of 1,500 rpm.

3) Using a FACE contact angle meter CA-X150 (a product name, manufactured by Kyowa Interface Science Co., Ltd.), the injector fitted to the apparatus is brought into contact with the dried resist film (on contact between the injector and the resist film, 2 µL of pure water is released onto the resist film surface), and the contact angle is measured.

By using a positive resist composition of the third aspect, the level of defects can be reduced. Furthermore, the required lithography characteristics can also be obtained. Moreover, the sensitivity also improves. Furthermore, the required lithography characteristics can also be obtained using a shrink process described below.

In the third aspect, the reason that a reduction in defects is achieved is not entirely clear, but the following reasoning is thought likely.

Namely, a resist pattern is obtained by applying the positive resist composition to a substrate, conducting a prebake, performing selective exposure, and then conducting PEB (post exposure baking) and performing alkali developing, but in the alkali developing step, following dissolution and removal of the exposed portions of the resist using the alkali developing solution, any residual developing solution and the like is usually removed by rinsing with pure water.

During this rinse, because the positive resist composition of this third aspect generates a resist film that exhibits a small contact angle at the resist surface, meaning the surface is readily wet (has a high level of hydrophilicity), it is thought that the affinity with comparatively hydrophobic solid components that can cause defects (including those components that re-precipitate during rinsing), such as deposits that contain resin components and residual substances that are left undissolved by the developing solution, is reduced, meaning these deposits and residual substances can be readily removed from the resist film surface during the alkali developing and rinsing steps, thereby leading to a reduction in the level of defects.

[Method for Forming Resist Pattern (Fourth Aspect)] <General Method>

A method for forming a resist pattern according to the present invention can be conducted, for example, in the manner described below.

Namely, a positive resist composition described above is first applied to a support such as a silicon wafer using a spinner or the like, a prebake is then conducted under temperature conditions of 80 to 150° C., for a period of 40 to 120 seconds, and preferably for 60 to 90 seconds, and following selective exposure (irradiation) of the thus obtained film with an ArF exposure apparatus or the like, by irradiating ArF excimer laser light through a desired mask pattern, PEB (post exposure baking) is conducted under temperature conditions of 80 to 150° C., for a period of 40 to 120 seconds, and preferably for 60 to 90 seconds. Subsequently, developing is conducted using an alkali developing solution such as a 0.1 to 10% by weight aqueous solution of tetramethylammonium hydroxide. In this manner, a resist pattern that is faithful to the mask pattern can be obtained.

An organic or inorganic anti-reflective film may also be provided between the support (substrate) and the applied layer of the resist composition.

As the support, conventional materials can be used without any particular restrictions, and suitable examples include substrates for electronic componentry, as well as substrates on which a predetermined wiring pattern has already been formed.

Specific examples of suitable substrates include silicon wafers, metal-based substrates such as copper, chrome, iron, and aluminum, as well as glass substrates.

Suitable materials for the wiring pattern include copper, solder, chrome, aluminum, nickel, and gold.

There are no particular restrictions on the wavelength used for the exposure (irradiation), and an ArF excimer laser, KrF excimer laser, $F_2$ excimer laser, or other radiation such as EUV (extreme ultraviolet), VUV (vacuum ultraviolet), EB (electron beam), X-ray or soft X-ray radiation can be used. A positive resist composition according to the present invention is particularly effective for use with an ArF excimer laser.

<Application to Shrink Process>

A positive resist composition of the present invention can be used favorably within a shrink process detailed below. In other words, even when applied to a shrink process, the composition is able to yield favorable lithography characteristics.

The applicants of the present invention have previously proposed a shrink process that includes the steps of forming a resist pattern on top of a support, forming a water-soluble coating on top of the resist pattern, and then shrinking this water-soluble coating by heat treatment and using the heat shrinkage effect to narrow the resist pattern size (for example, see Japanese Unexamined Patent Application, First Publication No. 2003-107752 and Japanese Unexamined Patent Application, First Publication No. 2003-202679).

The shrink process is a method in which, following the covering of a resist pattern with a water-soluble coating, this water-soluble coating is shrunk by heat treatment, and this heat shrinkage action is used to narrow the spacing of the resist pattern.

A method for forming a resist pattern that includes the conducting of a shrink process can be conducted, for example, in the manner described below.

First, a resist pattern is formed using the general type of method described above.

Subsequently, following developing of the resist pattern, a shrink process is conducted to narrow the resist pattern size.

In the shrink process, first, a water-soluble coating formation agent containing a water-soluble polymer or the like is applied to the surface of the resist pattern formed on the support, preferably forming a laminate in which the water-soluble coating covers the entire surface of the resist pattern.

Following application of the water-soluble coating formation agent, the support may be subjected to a prebake at a temperature of 80 to 100° C. for a period of 30 to 90 seconds.

The application of the water-soluble coating formation agent can be conducted using a known method used in the formation of conventional resist layers and the like. In other words, an aqueous solution of the coating formation agent can be applied to the resist pattern using a spinner or the like.

The thickness of the water-soluble coating is preferably either similar to the height of the photoresist pattern, or of a height sufficient to cover the pattern, and is typically within a range from approximately 0.1 to 0.5 µm.

Subsequently, the thus obtained laminate is subjected to heat treatment, causing the water-soluble coating to undergo heat shrinkage. As a result of this heat shrinkage action on the water-soluble coating, the side walls of the resist pattern that contact the water-soluble coating are pulled together, thereby narrowing the spacing (between patterns) of the resist-free portions within the resist pattern. As a result, the pattern can be reduced in size.

In the shrink process, the heat treatment is conducted at a temperature that is sufficient to cause shrinkage of the water-soluble coating, and is conducted at a heating temperature and for a heating period that does not cause fluidization of the resist.

The heating temperature is preferably set to a value that is from 3 to 50° C. lower, and even more preferably approximately 5 to 30° C. lower, than the temperature (the fluidization temperature) at which heat treatment starts to causes spontaneous flow of the resist pattern formed on the support. Moreover, if the shrinking performance of the water-soluble coating is also taken into consideration, then a preferred heat treatment is typically conducted within a temperature range from 80 to 160° C., and preferably from 130 to 160° C. In the positive resist composition of the first aspect, the pattern is able to be narrowed even when the heating temperature is set to a comparatively low temperature. Favorable temperature conditions are typically within a range from 70 to 150° C.

The fluidization temperature of a resist pattern varies depending on the nature and blend quantities of the components contained within the resist composition.

The heating time varies depending on the heating temperature, but is typically within a range from 30 to 90 seconds.

Subsequently, the water-soluble coating remaining on the resist pattern is removed by washing with an aqueous solvent, and preferably with pure water, for 10 to 60 seconds. The water-soluble coating is easily removed by washing with water, and is able to be completely removed from the support and the resist pattern.

As follows is a description of a water-soluble coating formation agent that is suitable for the above shrink process.

The water-soluble coating formation agent contains a water-soluble polymer.

A water-soluble coating formation agent containing this type of water-soluble polymer is ideal for use within the shrink process.

From an industrial viewpoint, the water-soluble polymer used is preferably selected from amongst acrylic-based polymers, vinyl-based polymers, cellulose derivatives, alkylene glycol-based polymers, urea-based polymers, melamine-based polymers, epoxy-based polymers and amide-based polymers.

Acrylic-based polymers refer to polymers that contain an acrylic-based monomer, vinyl-based polymers refer to polymers that contain a vinyl-based monomer, cellulose-based polymers refer to polymers that contain a cellulose-based monomer, alkylene glycol-based polymers refer to polymers that contain an alkylene glycol-based monomer, urea-based polymers refer to polymers that contain a urea-based monomer, melamine-based polymers refer to polymers that contain a melamine-based monomer, epoxy-based polymers refer to polymers that contain an epoxy-based monomer, and amide-based polymers refer to polymers that contain an amide-based monomer.

These polymers can be used either alone, or in mixtures of two or more different polymers.

Specific examples of suitable acrylic-based polymers include polymers or copolymers containing structural units derived from monomers such as acrylic acid, acrylamide, methyl acrylate, methacrylic acid, methyl methacrylate, N,N-dimethylacrylamide, N,N-dimethylaminopropylmethacrylamide, N,N-dimethylaminopropylacrylamide, N-methylacrylamide, diacetone acrylamide, N,N-dimethylaminoethyl methacrylate, N,N-diethylaminoethyl methacrylate, N,N-dimethylaminoethyl acrylate, and acryloyl morpholine.

Specific examples of suitable vinyl-based polymers include polymers or copolymers containing structural units derived from monomers such as morpholine, N-vinylpyrrolidone, vinylimidazolidinone, and vinyl acetate.

Specific examples of suitable cellulose derivatives include hydroxypropyl methylcellulose phthalate, hydroxypropyl methylcellulose acetate phthalate, hydroxypropyl methylcellulose hexahydrophthalate, hydroxypropyl methylcellulose acetate succinate, hydroxypropyl methylcellulose, hydroxypropyl cellulose, hydroxyethyl cellulose, cellulose acetate hexahydrophthalate, carboxymethylcellulose, ethylcellulose, and methylcellulose.

Specific examples of suitable alkylene glycol-based polymers include addition polymers or addition copolymers of monomers such as ethylene glycol or propylene glycol.

Specific examples of suitable urea-based polymers include polymers containing structural units derived from monomers such as methylolated urea, dimethylated urea, and ethylene urea.

Specific examples of suitable melamine-based polymers include polymers containing structural units derived from monomers such as methoxymethylated melamine, methoxymethylated isobutoxymethylated melamine, and methoxyethylated melamine.

In addition, water-soluble epoxy-based polymers and nylon-based polymers and the like can also be used.

Of the above water-soluble polymers, those containing at least one polymer selected from a group consisting of alkylene glycol-based polymers, cellulose-based polymers, vinyl-based polymers and acrylic-based polymers is preferred, and acrylic-based polymers are the most preferred as they also offer simple pH adjustment. In addition, using a copolymer of an acrylic-based monomer and another non-acrylic monomer is preferred, as such copolymers enable efficient narrowing of the photoresist pattern size, while maintaining the shape of the photoresist pattern during the heat treatment.

Water-soluble polymers that include N-vinylpyrrolidone as a proton donor monomer and acrylic acid as a proton acceptor monomer are particularly preferred as they exhibit a particularly large shrinkage ratio on heating. In other words, the water-soluble polymer preferably contains structural units derived from acrylic acid and structural units derived from vinylpyrrolidone.

In those cases where a copolymer is used as the water-soluble polymer, there are no particular restrictions on the relative blend proportions of the structural components, although in the case of a mixture, if long term stability is considered particularly important, then the blend proportion of the acrylic-based polymer is preferably greater than that of the other structural polymers. In order to improve the long term stability, besides increasing the proportion of the acrylic-based polymer as described above, an acidic compound such as p-toluenesulfonic acid or dodecylbenzenesulfonic acid can also be added.

The water-soluble coating formation agent preferably also contains a surfactant. By using a surfactant, the occurrence of defects can be effectively prevented.

Furthermore, from the viewpoints of preventing impurities and enabling favorable pH adjustment, the water-soluble coating formation agent may also contain an optional water-soluble amine.

Moreover, from the viewpoints of reducing the photoresist pattern size and suppressing the occurrence of defects, an additional non-amine-based water-soluble organic solvent may also be added to the water-soluble coating formation agent if desired.

The water-soluble coating formation agent is preferably used in the form of a solution within either water or a water-alcohol-based solvent (in which the alcohol concentration is no higher than approximately 30% by weight relative to the water), with a concentration of 3 to 50% by weight, and even more preferably from 5 to 20% by weight.

EXAMPLES

Example 1

The copolymer, component (B), component (D), and organic solvent listed below were mixed together to form a solution, thus yielding a positive resist composition with a solid fraction concentration of 8% by weight.

The contact angle for a resist film formed from this resist composition, following application of a developing solution, was 37.7 degrees (37.7°). Furthermore, the Tg value for the copolymer was 120° C. The Tg value (glass transition temperature) was measured using a thermal analysis apparatus TG/DTA6200 (manufactured by Seiko Instruments, Inc.) under conditions including a rate of temperature increase of 10° C./minute.

Copolymer: 100 Parts by Weight

A copolymer formed from the structural units represented by a chemical formula (1) shown below, in which the molar ratio l/m/n=40 mol %/40 mol %/20 mol %, with a weight average molecular weight of 10,000, and a polydispersity [Mw (weight average molecular weight)/Mn (number average molecular weight)] of 2.0.

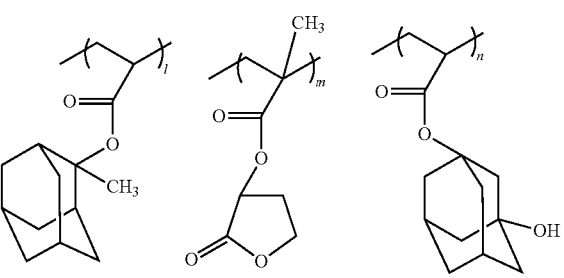

(1)

Component (B): 3.5 Parts by Weight
A compound represented by a chemical formula shown below.

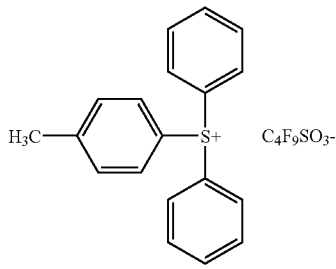

Component (D): 0.1 Parts by Weight
Triethanolamine
Organic Solvent
A mixed solvent in which PGMEA/EL=6:4 (weight ratio)

Comparative Example 1

The copolymer, component (B), component (D), and organic solvent listed below were mixed together to form a solution, thus yielding a positive resist composition with a solid fraction concentration of 8% by weight. The contact angle for a resist film formed from this resist composition, following application of a developing solution, was 51.8 degrees (51.8°). Furthermore, the Tg value for the copolymer was 138° C.
Copolymer: 100 Parts by Weight
A copolymer formed from the structural units represented by a chemical formula (2) shown below, in which the molar ratio l'/m'/n'=40 mol %/40 mol %/20 mol %, with a weight average molecular weight of 10,000, and a polydispersity [Mw (weight average molecular weight)/Mn (number average molecular weight)] of 2.0.

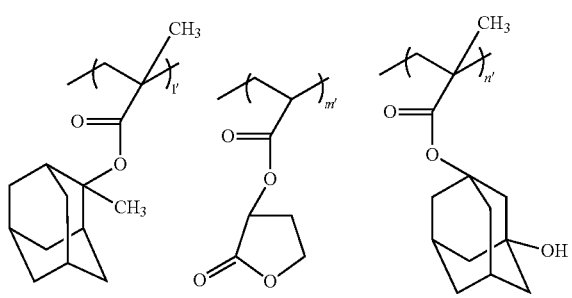

(2)

Component (B): as for the example 1, Component (D): as for the example 1, Organic solvent: as for the example 1.
[Test Methods]
The resist compositions of the example 1 and the comparative example 1 were evaluated in the manner described below.
(1) Normal Process (Evaluation of Resolution)
An organic anti-reflective film composition "ARC-29A" (a product name, manufactured by Brewer Science Ltd.) was applied to the surface of an 8-inch silicon wafer using a spinner, and the composition was then baked and dried on a hotplate at 205° C. for 60 seconds, thereby forming an organic anti-reflective film with a film thickness of 77 nm.

The positive resist composition was then applied to the surface of this anti-reflective film using a spinner, and was then prebaked (PAB) and dried on a hotplate at 110° C. for 90 seconds, thereby forming a resist layer with a film thickness of 225 nm.

Subsequently, this layer was selectively irradiated with an ArF excimer laser (193 nm) through a (half-tone) mask pattern, using an ArF exposure apparatus NSR-S306 (manufactured by Nikon Corporation; NA (numerical aperture)=0.78, ⅔ annular illumination).

The resist was then subjected to PEB treatment at 100° C. for 90 seconds, subsequently subjected to puddle development for 60 seconds at 23° C. in a 2.38% by weight aqueous solution of tetramethylammonium hydroxide, and was then washed for 20 seconds with water, and dried, thus forming a resist pattern.

The following four patterns were formed.

(1-1) An isolated hole pattern with a hole diameter of 100 nm, (1-2) an isolated hole pattern with a hole diameter of 130 nm, (2-1) a dense hole pattern with a hole diameter of 100 nm (a pattern in which holes of diameter 100 nm were spaced at 100 nm intervals), (2-2) a dense hole pattern with a hole diameter of 130 nm (a pattern in which holes of diameter 130 nm were spaced at 130 nm intervals).

The sensitivity at the time of formation of each of these patterns was (1-1) 23.0 mJ/cm$^2$, (1-2) 30.5 mJ/cm$^2$, (2-1) 32.0 mJ/cm$^2$, and (2-2) 42.5 mJ/cm$^2$, indicating a higher level of sensitivity for the resist composition of the example.
(Evaluation of Defects)

The positive resist compositions of the example 1 and the comparative example 1 were each applied directly to the surface of an 8-inch silicon wafer using a spinner, and were then prebaked (PAB) and dried on a hotplate at 105° C. for 90 seconds, thereby forming a resist layer with a film thickness of 220 nm in each case.

Subsequently, each layer was selectively irradiated with an ArF excimer laser (193 nm) through a (binary) mask pattern, using an ArF exposure apparatus NSR-S306 (manufactured by Nikon Corporation; NA (numerical aperture)=0.78, ⅔ annular illumination).

Each resist was then subjected to PEB treatment at 100° C. for 90 seconds, subsequently subjected to puddle development for 60 seconds at 23° C. in a 2.38% by weight aqueous solution of tetramethylammonium hydroxide, and a rinse liquid was then dripped onto the resist for 1 second at 1,000 rpm and then for 15 seconds at 500 rpm (enforced conditions for increasing the likelihood of defect occurrence), before the resist was dried to form a resist pattern. In the aforementioned section entitled "Evaluation of Resolution", a normal rinse process was conducted, in which the rinse liquid was dripped onto the resist for 10 seconds at 2,000 rpm and then for 50 seconds at 1,000 rpm.

Furthermore, the pattern was formed as a dense hole pattern with a hole diameter of 300 nm (a pattern in which holes of diameter 300 nm were spaced at 300 nm intervals).

Subsequently, the resist was measured using a surface defect inspection device KLA2351 (a product name) manufactured by KLA Tencor Corporation, and evaluation of the number of defects within the wafer revealed a value of 257 defects per 8-inch wafer for the example 1, and 22,535 defects per 8-inch wafer for the comparative example 1.
(Depth of Focus Characteristics)

Resist patterns were formed in the same manner as described above in the section entitled "Evaluation of Resolution", and the depth of focus (DOF) was then measured.

In the case of the example 1, the following measurement results were obtained. (1-1) An isolated hole pattern with a hole diameter of 100 nm: 0.25 μm, (1-2) an isolated hole pattern with a hole diameter of 130 nm: 0.30 μm, (2-1) a dense hole pattern with a hole diameter of 100 nm: 0.35 μm, (2-2) a dense hole pattern with a hole diameter of 130 nm: 0.50 μm.

In the case of the comparative example 1, the following measurement results were obtained.

(1-1) An isolated hole pattern with a hole diameter of 100 nm: 0.25 μm, (1-2) an isolated hole pattern with a hole diameter of 130 nm: 0.25 μm, (2-1) a dense hole pattern with a hole diameter of 100 nm: 0.25 μm, (2-2) a dense hole pattern with a hole diameter of 130 nm: 0.25 μm.

(2) Shrink Process

Using the positive resist compositions of the example 1 and the comparative example 1, when a shrink process was conducted on the resist patterns (1-2) and (2-2) described above, the hole diameter was shrunk to a diameter of 100 nm in each case. Moreover, when the 5 tests below were then conducted, there was no difference between the compositions in each of the five sets of test results.

(i) Depth of focus characteristics of an isolated hole pattern, (ii) depth of focus characteristics of a dense hole pattern, (iii) dependency of the amount of shrinkage on the exposure dose, (iv) the proximity effect (in a dense hole pattern, when the hole diameter was fixed at 100 nm and the spacing between holes was varied, the relationship between the spacing and the size of the hole that was actually formed), and (v) the pattern shape.

Using the water-soluble coating formation agent described below, the heating temperature for the shrink process was set to 140° C. for the example 1 and 150° C. for the comparative example 1. In other words, in the case of the example, the pattern was able to be narrowed even when the shrink process temperature was lowered. It is thought that this observation is due to that fact that the Tg value of the resin of the example 1 is lower than the Tg value of the resin of the comparative example 1.

Water-soluble coating formation agent: FSC5000EX (a product name, manufactured by Tokyo Ohka Kogyo Co., Ltd.)

The above results confirm that by using the positive resist composition of the example 1 according to the present invention, the level of defects can be reduced dramatically.

Furthermore, the depth of focus characteristics in the case of the resist patterns (1-1) and (2-1) were superior to those of the comparative example 1. The pattern shapes in the example 1 were no different from those of the comparative example 1, indicating that conventional levels of characteristics were able to be maintained. Furthermore, because the sensitivity was higher in the example 1 than in the comparative example 1, an improvement in throughput can be anticipated. Moreover, even when a shrink process was conducted, the example 1 exhibited no differences from the comparative example 1, confirming that conventional levels of characteristics were able to be maintained.

Examples 2 and 3, Comparative Example 2

Production of Resist Compositions 1, 2, 3

(1) With the exception of using a copolymer 2-1 described below as the component (A), a resist composition was produced in the same manner as the example 1. This composition was termed the resist composition 1.

The measured value of the contact angle for this resist composition 1 was 44.45 degrees (44.45°) (comparative example 2).

Copolymer 2-1: 100 Parts by Weight

A copolymer formed from the structural units represented by the chemical formula (1) shown above, in which the molar ratio l/m/n=40 mol %/40 mol %/20 mol %, with a weight average molecular weight of 10,000, and a polydispersity [Mw (weight average molecular weight)/Mn (number average molecular weight)] of 2.0.

(2) Subsequently, a resist composition was produced using a copolymer 2-2 described below as the component (A).

In other words, with the exception of using the copolymer 2-2 described below instead of the copolymer 2-1, a resist composition was produced in the same manner as the example 1. This composition was termed the resist composition 2.

Copolymer 2-2: 100 Parts by Weight

A copolymer 2-2 formed from the same structural units, in the same proportions, as the copolymer 2-1, with the same weight average molecular weight and the same polydispersity, and differing from the copolymer 2-1 only in terms of the production lot.

The measured value of the contact angle for this resist composition 2 was 33.72 degrees (33.72°) (example 2).

(3) Using the measured values of the contact angle from (1) and (2), the copolymer 2-1 and the copolymer 2-2 were mixed together in a mixing ratio that was calculated to yield a contact angle for the resulting mixed resist composition that was no higher than 40 degrees.

Then, with the exception of using a base resin produced by mixing together the copolymer 2-1 and the copolymer 2-2 in a mixing ratio of 1:1 (weight ratio) instead of the copolymer 2-1, a resist composition was produced in the same manner as (1) above. This composition was termed the resist composition 3.

The measured value of the contact angle for this resist composition 3 was 38.87 degrees (38.87°) (example 3).

(Evaluation)

When the resist compositions 1, 2, and 3 were measured for defects in accordance with the above section entitled "Evaluation of Defects", the result for the resist composition 1 was 27,598 defects per 8-inch wafer. The result for the resist composition 2 was 69 defects per 8-inch wafer. The result for the resist composition 3 was 354 defects per 8-inch wafer.

In this manner, the defect evaluation results for the resist compositions 2 and 3 (the examples 2 and 3), in which the measured value of the contact angle was no higher than 40 degrees, were particularly favorable. In contrast, the defect evaluation result for the resist composition 1 (the comparative example 2) in which the measured value of the contact angle exceeded 40 degrees was poor. From these results it is evident that even if copolymers formed from the same structural units in the same proportions are used, the measured value of the contact angle can vary considerably depending on factors such as the production lot.

Furthermore, it is also very clear that resists for which the contact angle is large exhibit particularly poor defect characteristics.

It is clear that by designing the make-up of a resist composition based on measured values of the contact angle, a resist composition can be obtained for which the measured value of the contact angle is no higher than 40 degrees, thereby enabling the level of defects to be reduced.

Comparative Examples 3 to 6

In order to investigate the effects of the measured value of the contact angle, resist compositions of comparative examples 3 through 6 were prepared in the manner described below, and subsequently evaluated for defects.

Comparative Example 3

With the exception of using a copolymer represented by a chemical formula (3) shown below (p:q:r=40 mol %:40 mol %:20 mol %, weight average molecular weight: 10,000, polydispersity: 2.1), a resist composition was produced in the same manner as the example 1, and subsequently evaluated for defects.

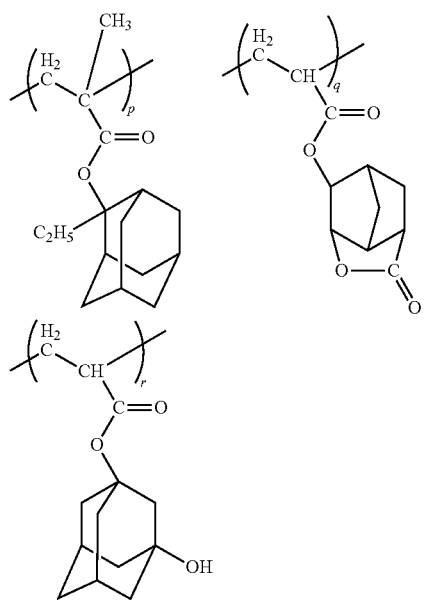

(3)

Comparative Example 4

With the exception of using a copolymer represented by a chemical formula (4) shown below (p':q':r'=40 mol %:40 mol %:20 mol %, weight average molecular weight: 7,000, polydispersity: 1.5), a resist composition was produced in the same manner as the example 1, and subsequently evaluated for defects.

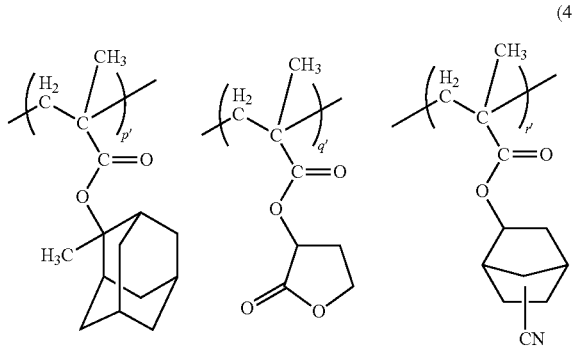

(4)

Comparative Example 5

With the exception of using a copolymer represented by a chemical formula (5) shown below in which —S—CH$_2$—CH$_2$—CH$_2$—C(CF$_3$)$_2$—OH groups had been introduced at the polymer terminals in a quantity equivalent to 2 mol % relative to 100 mol % of the polymer (p":q":r"=40 mol %:40 mol %:20 mol %, weight average molecular weight: 6,500, polydispersity: 1.6), a resist composition was produced in the same manner as the example 1, and subsequently evaluated for defects.

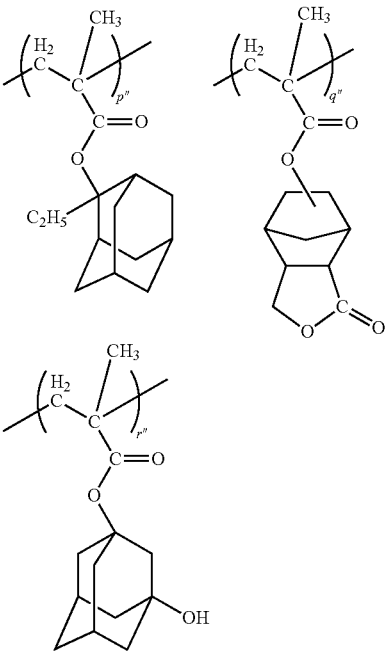

(5)

Comparative Example 6

With the exception of using a copolymer represented by a chemical formula (6) shown below (p''':q''':r'''=50 mol %:40 mol %:10 mol %, weight average molecular weight: 10,000, polydispersity: 2.0), a resist composition was produced in the same manner as the example 1, and subsequently evaluated for defects.

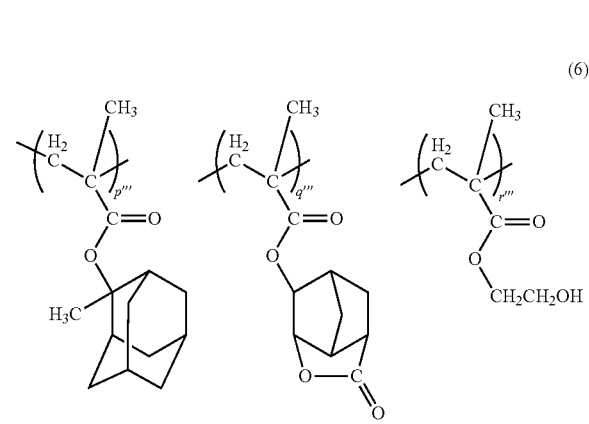

(6)

The defect evaluation results for these comparative examples, together with the results for the examples 1 through 3 and the comparative examples 1 and 2, are summarized in Table 1.

As is evident from the results in Table 1, amongst resist compositions formed using different structural units and different combinations of structural units, the defect evaluation result is favorable for those resist compositions for which the measured value of the contact angle is no higher than 40, but is poor for those compositions in which the measured value exceeds 40.

TABLE 1

| | Chemical formula for copolymer | Contact angle (°) | Defects (number per 8-inch wafer) |
|---|---|---|---|
| Example 1 | Formula (1) | 37.7 | 257 |
| Comparative example 1 | Formula (2) | 51.18 | 22,535 |
| Comparative example 2 | Formula (1) | 44.45 | 27,598 |
| Example 2 | Formula (1) | 33.72 | 69 |
| Example 3 | Formula (1) | 38.87 | 354 |
| Comparative example 3 | Formula (3) | 48.06 | 7,400 |
| Comparative example 4 | Formula (4) | 43.69 | 17,091 |
| Comparative example 5 | Formula (5) | 46.85 | 7,666 |
| Comparative example 6 | Formula (6) | 43.33 | 5,964 |

The invention claimed is:

1. A positive resist composition, consisting of:

a resin component (A) that exhibits increased alkali solubility under action of acid;

an acid generator component (B) that generates acid on exposure;

a nitrogen-containing organic compound (D); and an organic solvent, wherein said component (A) is a copolymer (A1) that consists of a structural unit (a1) derived from an acrylate that contains an acid dissociable, dissolution inhibiting group; a structural unit (a2) derived from a methacrylate that contains a lactone ring; and a structural unit (a3) derived from an acrylate that contains a polar group-containing polycyclic group, wherein the structural unit (a1) is a structural unit represented by the general formula (I) shown below:

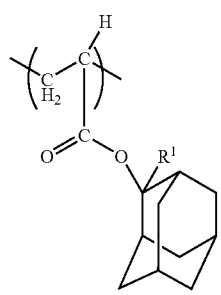

(I)

[wherein, $R^1$ represents a lower alkyl group], the structural unit (a2) is a structural unit represented by the general formula (IV) shown below:

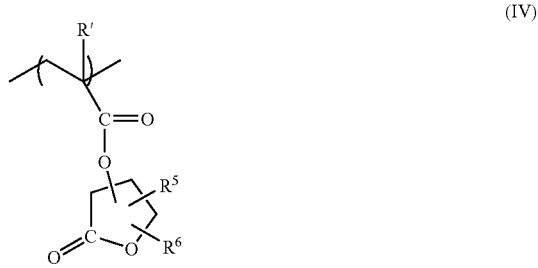

(IV)

[wherein, R' represents a methyl group, and $R^5$ and $R^6$ represent hydrogen atoms], and the structural unit (a3) is a structural unit represented by the general formula (VIII) shown below:

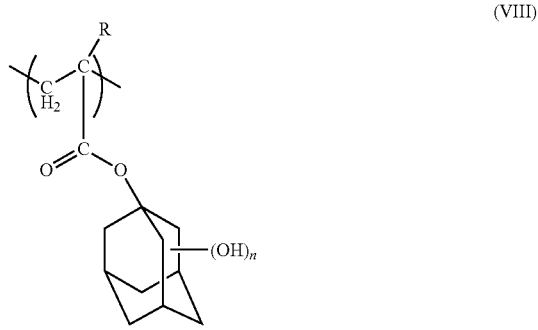

(VIII)

[wherein, R represents a hydrogen atom, n is 1, and the hydroxyl group is bonded to position 3 of the adamantyl group], and wherein the proportion of the structural unit (a1), relative to the combined total of all the structural units that constitute the component (A1), is within a range from 30 to 50 mol %, the proportion of the structural unit (a2), relative to the combined total of all the structural units that constitute the component (A1), is within a range from 20 to 60 mol % and the proportion of the structural unit (a3), relative to the combined total of all the structural units that constitute the component (A1), is within a range from 10 to 50 mol %.

2. The positive resist composition according to claim 1, wherein said copolymer (A1) consists of structural units represented by a chemical formula shown below.

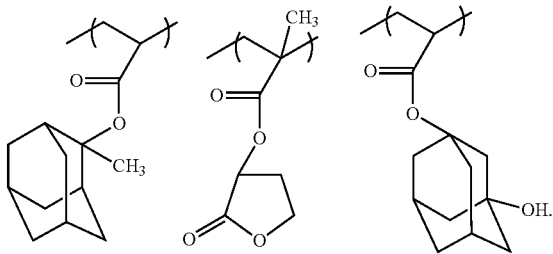

3. The positive resist composition according to claim 1, wherein the copolymer (A1) is formed from the structural units represented by the general formula (I) shown below:

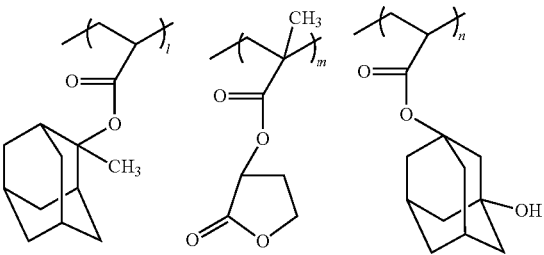

(1)

[wherein, the molar ratio l/m/n is 40 mol %/40 mol %/20 mol %].

4. A resist film formed from the positive resist composition of claim 1, wherein the resist film has a measured contact angle not greater than 40 degrees at a surface of said resist film after applying a developing solution to said surface of said resist film.

* * * * *

UNITED STATES PATENT AND TRADEMARK OFFICE
CERTIFICATE OF CORRECTION

PATENT NO. : 8,097,396 B2  
APPLICATION NO. : 11/597005  
DATED : January 17, 2012  
INVENTOR(S) : Hiroaki Shimizu and Masaru Takeshita Page 1 of 1

It is certified that error appears in the above-identified patent and that said Letters Patent is hereby corrected as shown below:

At Column 29, Line 27, change "methylolated" to --methylated--.

At Column 39, Line 11, In Claim 2, change "below." to --below:--.

At Column 39, Line 27, In Claim 3, change "(I)" to --(1)--.

At Column 40, Line 15, In Claim 3, change "1/m/n" to --l/m/n--.

Signed and Sealed this  
Twelfth Day of June, 2012

David J. Kappos  
*Director of the United States Patent and Trademark Office*